Nov. 27, 1956 S. DEUTSCH ET AL 2,772,355

WIDE RANGE TUNER

Filed July 5, 1951 3 Sheets-Sheet 1

INVENTORS
Sid Deutsch
Herbert A. Finke
BY Ralph B. Stewart
ATTORNEY

INVENTORS
Sid Deutsch
Herbert A. Finke
BY Ralph B. Stewart
ATTORNEY

WIDE RANGE TUNER
Filed July 5, 1951 3 Sheets-Sheet 3
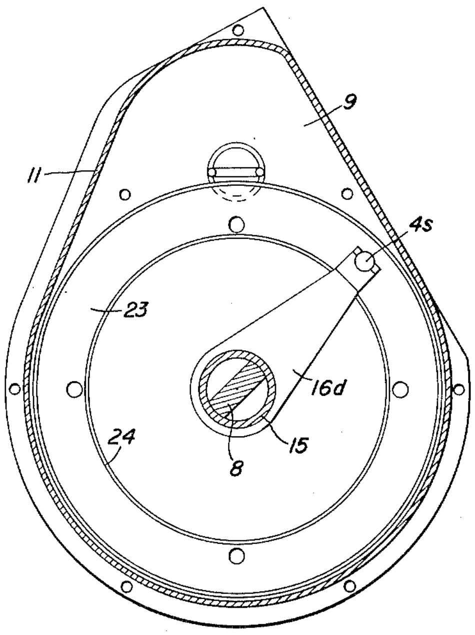
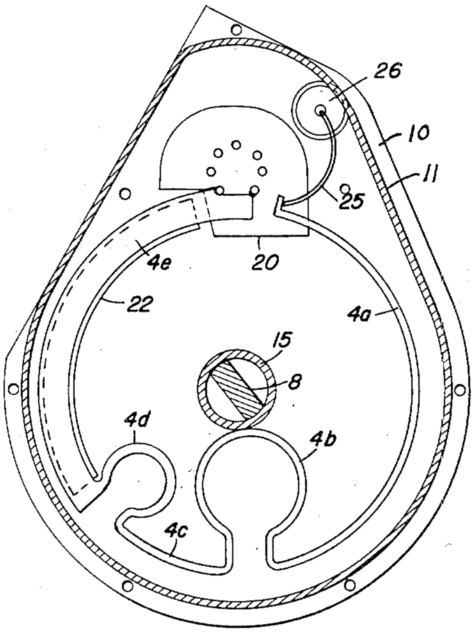
Fig. 6. Fig. 7.
Fig. 8.
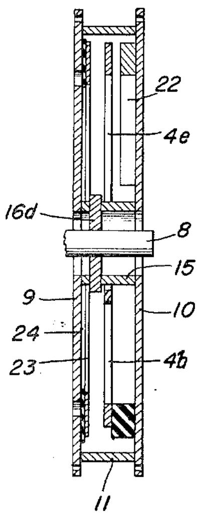
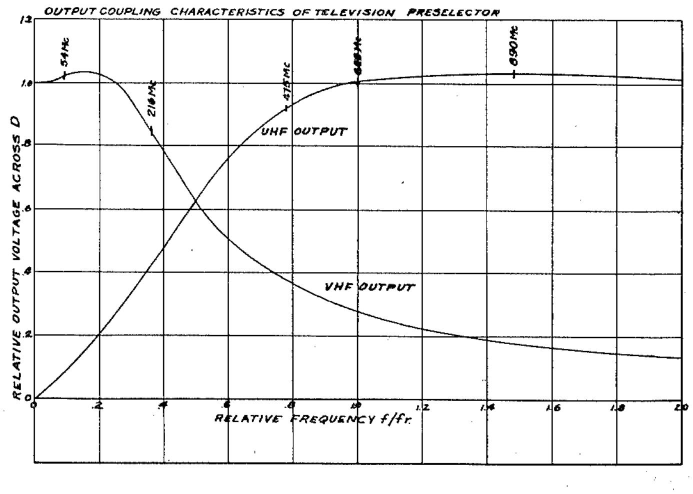
Fig. 9.
INVENTORS
Sid Deutsch
Herbert A. Finke
BY Ralph B. Stewart
ATTORNEY

United States Patent Office 2,772,355

Patented Nov. 27, 1956

2,772,355

WIDE RANGE TUNER

Sid Deutsch and Herbert A. Finke, Brooklyn, N. Y., assignors to Polytechnic Research & Development Co., Inc., Brooklyn, N. Y., a corporation of New York Application July 5, 1951, Serial No. 235,117

15 Claims. (Cl. 250—20)

This invention relates to a radio tuner especially useful in the television band of radio waves.

A broad object of the invention is to devise a tuner capable of covering a wide range of frequencies in the very high frequency and ultra-high frequency bands. By way of example, a tuner, according to the invention, may be designed to cover the range from 54 megacycles up to 890 megacycles using only one tuning control movable through almost 360 degrees.

The invention involves two or more tunable lines which are coupled in cascade in a receiving channel. Each tuned line is in the form of a coaxial cable or shielded conductor having a short-circuiting slider which varies the effective length of the line and thereby tunes the line.

Another object of the invention is to devise a novel arrangement for coupling the tuned lines in cascade in the receiving channel.

Still another object is to devise an improved arrangement for coupling a source of waves to the first tuned line of the tuner and also for coupling the last tuned line in the tuner to an output circuit, such coupling arrangements providing good energy transfer throughout a wide range of frequencies.

Another object is to provide a tuner in which a band of frequencies at the high-frequency end of the tuning range is selected in a tunable receiving channel having an output loop coupled thereto, the remaining frequencies in the range being selected in a second tunable channel having a separate output loop coupled thereto, and including a novel arrangement for coupling the two output loops to a common detector without serious interference between the two channels.

In the preferred form of the tuner each tunable line is formed with a gap in the center conductor thereof, thus dividing each line into two linear sections, one covering the high frequency portion of the tuning range and the other covering the low frequency portion of the tuning range. The high frequency sections of the tunable lines are connected in cascade to form the high frequency channel of the receiver, while the low frequency sections of the lines are connected in cascade to form the low frequency channel of the receiver. A single set of short-circuiting sliders serves both channels of the receiver.

Another feature of the invention is the inclusion of an amplifier in the low frequency channel of the receiver for amplifying the signals in this channel.

In the preferred form of the invention, the tuned lines are constructed in circular form and the short-circuiting sliders are mounted upon arms which rotate about a common axis.

Another feature of the invention is that the line conductor of each tuned line is mounted so that its short-circuiting slider can rotate through more than one revolution to permit free movement of the slider from one end of the tuning range to the other without back-tracking.

In the preferred form of the invention, each tuned line is formed with one or more gaps at intermediate points therein and each gap is shunted by a loop section to skip or jump a predetermined frequency band within the tuning range. Trimmer condensers are connected from each terminal of each loop section to the conductor shield to secure proper tracking of the different lines.

Our improved tuner is especially useful as a preselector tuner in a superheterodyne receiver employing a local oscillator which also uses a tunable line similar to the tunable lines of the tuner and having its slider operated from a common operating shaft with the sliders of the tuner.

Another object is to improve the local oscillator by isolating the shield of the tuned oscillator line from the application of plate potential to the shield through the shorting slider of the line; providing a stabilizing condenser connected across the tuned line of the oscillator near the low frequency end thereof; by providing a capacitance element for increasing the distributed capacitance of the oscillator line over a portion of the high frequency end thereof; and by the use of a solenoidal choke in the heater leads of the oscillator tube having an antiresonant frequency located at or below the lowest frequency of the oscillator.

Another object is to improve the local oscillator so that the socket of the oscillator tube is enclosed within the shield of the oscillator line and supports one end of the oscillator line conductor so that the plate contact of the socket is in direct contact with the line conductor.

The invention is illustrated in the accompanying drawing, in which Figure 1 is a circuit diagram illustrating the preferred form of the invention as applied to a radio receiver for receiving waves in the very high and ultra-high frequency bands.

Figures 2 to 8, inclusive, illustrate one physical form of the tuner and oscillator structure represented in Figure 1;

Figure 6 is a sectional view of the oscillator section taken along line 6—6 of Figure 3;

Figure 7 is a sectional view of the oscillator section taken along the line 7—7 of Figure 3;

Figure 8 is a sectional view of Figure 3 taken along the line 8—8; and

Figure 9 shows two curves which illustrate the operation of the two output loops connected to a common detector.

Figure 1:
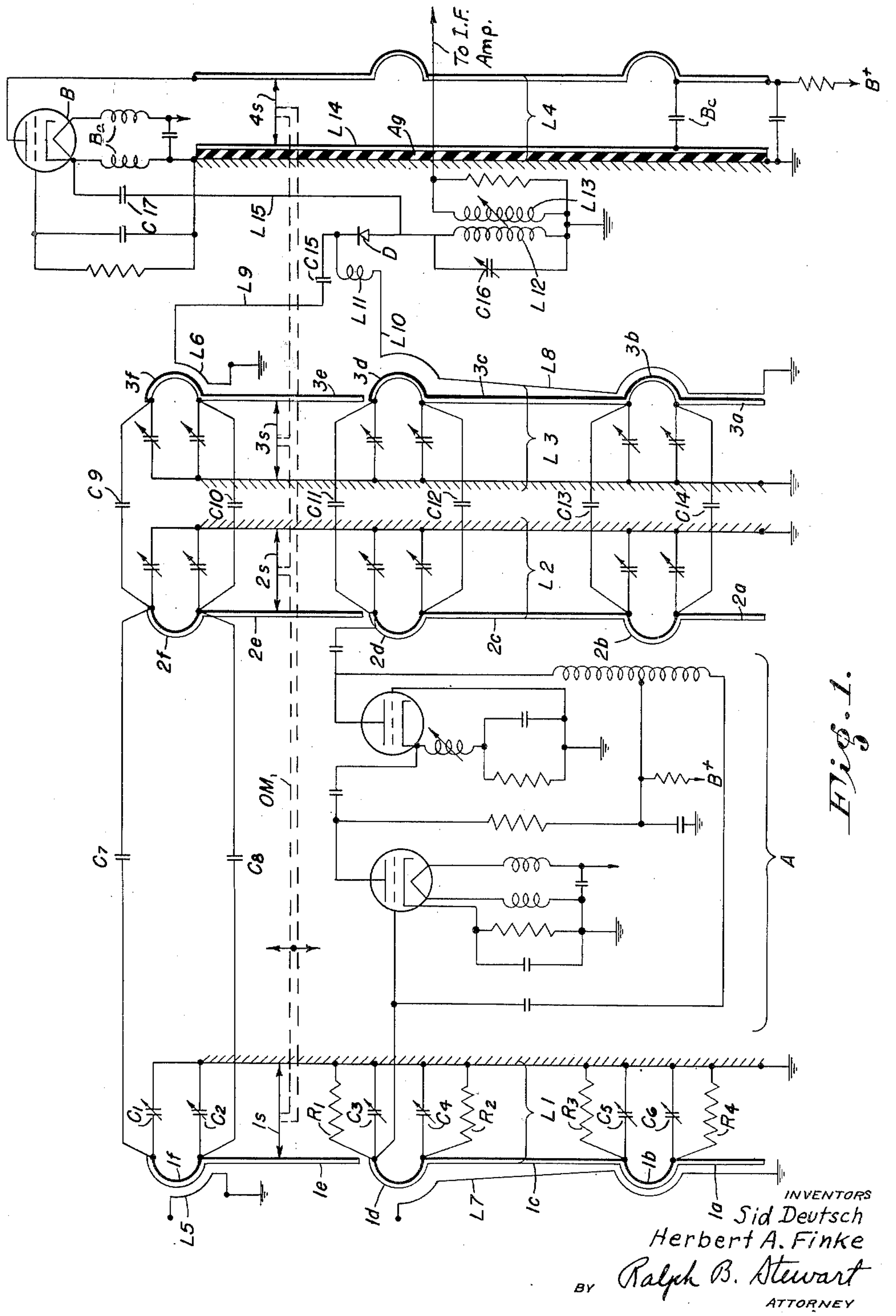

Referring to the drawing, Figure 1 is a circuit diagram illustrating the preselector tuner and local oscillator of a radio receiver of the superheterodyne type, suitable for receiving waves within the very high frequency and ultra-high frequency bands.

The tuner of Figure 1 involves three tunable lines which are coupled in cascade between the receiving antenna and the first detector for selecting the desired frequency within a given tuning range. As already explained, each tuned line is in the form of a coaxial cable or shielded conductor having a slider which varies the effective length of the line and thereby tunes the line. The local oscillator is also provided with a tuned line of similar construction for varying the frequency of the oscillator. The sliders of the tuner lines and the slider of the local oscillator are all ganged for simultaneous operation.

Referring now to Figure 1, the three tuner lines are shown at L1, L2, and L3, and the oscillator line is shown at L4. Each tuner line is formed of two main sections which are insulated from each other, one for the high frequency band of the tuning range and the other for the low frequency band, and each main section may be formed of two or more smaller sections. For example, the low frequency section of line L1 is formed of four smaller sections 1a, 1b, 1c and 1d, and the high frequency section is formed of smaller sections 1e and 1f, a small gap being provided between sections 1d and 1e. Line L2 is formed of similar sections 2a to 2f respectively. The short-circuiting sliders for the four tuned lines are shown at 1s, 2s, 3s, and 4s, respectively. The sliders are connected to a common operating member OM for simultaneous operation throughout the tuning range. Conductor sections 1a, 1c, and 1e of line L1 are arranged to be engaged by the slider 1s as it moves from one end of the line to the other, but conductor sections 1b, 1d and 1f are formed as loops which are curved or bent out of the path of the slider 1s and are arranged to bridge relatively short gaps (greatly exaggerated in Figure 1) between the sections of the conductor which are engaged by the slider 1s. The shielded conductors of lines L2 and L3 are arranged in sections in the same manner as line L1, as will be seen from Figure 1 of the drawing. The tuned line L4 of the oscillator also is divided into sections in the same manner as the tuner lines except that the oscillator line is continuous and is not provided with an end section corresponding to 1f of line L1.

As explained above, the high frequency sections of the tuner lines are isolated from the low frequency sections by a gap formed between the d and e sections of each line. Suitable trimmer condensers C1 to C6 are connected between the line shield and the ends of each loop section of line L1 for the purpose of obtaining accurate adjustment of the tuner to the desired frequency over the different sections. Similar trimmer condensers are provided on tuner lines L2 and L3.

Resistors R1 to R4 are connected in shunt to line L1 at the points shown for broadening the resonant characteristic of the line to cover the desired band, such as a band of 6 megacycles.

The high frequency sections of lines L1 and L2 are coupled together through coupling condensers C7 and C8 which couple loop section 2f with loop section 1f, and a similar pair of coupling condensers C9 and C10 couple section 3f of line L3 with section 2f of line L2.

Various arrangements may be used to apply the received waves to line L1 and to take off the waves from line L3. For example, the received waves may be applied to one end of an insulated conductor arranged in parallel inductive relation to the conductor of line L1 throughout both sections of the conductor, the other end being grounded to form an input loop. The effective length of the loop may be varied by a short-circuiting slider moving with the slider 1s. The output loop may be formed of a similar loop coupled to line L3. Another possible arrangement is to use a small loop inductively coupled to line L1 (or line L3) and mounted to move with the short-circuiting slider of the line so that it is always coupled to the effective portion of the line.

The preferred method of input and output coupling is shown in the drawing and involves the use of separate input and output loops for the two channels of the receiver. Thus, for the high frequency channel, input loop L5 is coupled to line section 1f and output loop L6 is coupled to line section 3f. In the low frequency channel, input loop L7 is coupled to line sections 1a to 1d inclusive and output loop L8 is coupled to line sections 3a to 3d inclusive. One end of each coupling line or loop is grounded and the other is connected to suitable input or output devices, such as a source of received waves and a detector.

The low frequency section of line L1 is coupled to low frequency section of line L2 through a suitable electron tube amplifier, represented at A. The input of the amplifier is connected to the upper terminal of line section 1d and the output is connected to the upper terminal of line section 2d. The low frequency sections of lines L2 and L3 are coupled together by two pairs of coupling condensers which join the terminals of line sections 2b and 2d with the terminals of line sections 3b and 3d, respectively; see condensers C11, C12 and C13, C14.

Coupling lines L7 and L8 are formed alike and each line, preferably, is formed of four sections coupled to sections a, b, c and d of the associated tuner line. As shown diagrammatically in Figure 1, the sections of the coupling line adjacent the low frequency end of the tuner line are closely coupled to the tuner line and the degree of coupling decreases progressively for the higher frequency sections.

Output loop L6 is connected through a coaxial line L9 to a detector D through a series condenser C15. Output coupling line L8 is connected to the same detector through a coaxial line L10 and inductance L11. Detector D, which may be a crystal detector, is connected in series with the primary winding L12 of an output transformer having a secondary winding L13, the primary winding being bridged by trimmer condenser C16. The secondary winding L13 is connected to the input of the intermediate frequency amplifier, not shown.

The local oscillator includes an electron tube B connected to the high frequency end of tuned line L4, the plate current of the tube being supplied through the line conductor from a suitable source of direct current connected to the low frequency end of the conductor.

For the purpose of preventing high voltage direct current from being applied to the shield of the oscillator line, an insulated track L14 is provided for the slider. This track is mounted upon an insulated support 4g carried by the shield or housing of the oscillator line. Thus, the insulated track L14 forms a condenser for conducting high frequency currents to the shield or ground from the oscillator line conductor through the slider 4s and prevents direct current from being applied to the shield.

Oscillator tube B is provided with suitable high frequency chokes Ba in the leads of the cathode and heater, and the cathode of the tube is connected to primary winding L12 through connection L15, including a series condenser C17. By this connection, current from the local oscillator is mixed with current supplied from the tuner to the detector D. The primary winding L12 is tuned to the beat frequency wave by condenser C16.

The chokes Ba preferably are wound as a two-conductor solenoid dimensioned so that its lowest anti-resonant frequency is substantially the same as, or below, the lowest frequency to be generated by the oscillator. This arrangement permits the oscillator to operate over a broad range of frequencies.

When the sliders are set to engage the lower ends of the "a" sections of the tuner lines, these lines are tuned to the lowest frequency in the range of frequencies to be received. By selecting the proper length of lines, this frequency may be, for example, 54 megacycles. As the sliders are moved upwardly to shorten the length of the lines, the frequency to which the tuner resonates increases. By proper design, the tuner may be made to resonate to 88 mc. at the lower terminal of section 1b, to 174 mc. at the upper terminal of section 1b, to 216 mc. at the lower terminal of section 1d, to 475 mc. at the lower terminal of section 1e, and to 890 mc. at the lower terminal of section 1f, which is the other end of the tuning range. It will be understood that loop sections b and d are provided in each line for jumping certain bands of frequencies, and the size and location of these loops will be determined by the width and location of the bands to be skipped. The oscillator is designed so that its frequency differs by a constant amount from the resonant frequency of the tuner in all positions of the sliders; for example, the oscillator may be designed to have a frequency of 44 mc. above the resonant frequency of the tuner in all positions of the sliders. In this case, the primary winding L12 would be tuned by condenser C16 to 44 megacycles.

Within the range from 54 mc. to 216 mc. the waves selected by the low frequency section of line L1 are amplified by amplifier A and are supplied through lines L2 and L3 to output coupling line L8. Within the range from 475 mc. to 890 mc. the amplifier A is not operative, but the waves selected in high frequency section of line L1 are transferred to line L2 through coupling condensers C7 and C8, and through coupling condensers C9 and C10 to line L3, and thence to output coupling loop L6.

As already explained, the tuner lines are divided into separated sections for the V. H. F. and the U. H. F. ranges, and separate coupling loops are employed for these two ranges because it has been found that a single coupling loop cannot cover both ranges to the best advantage.

If the two output coupling loops or lines were to be connected in parallel to a detector having a resistance $R_0$, the output of one coupling element would feed back into the other coupling element and vice versa. Also, one coupling line or element would act as a load upon the other element, thereby reducing the voltage applied to the detector, and the load seen by each line would not be $R_0$, so that reflections would be set up. These undesirable effects are greatly reduced by inserting the condenser C15 in line L9 and inductance L11 in line L10. For best results, lines L9 and L10 should have a characteristic impedance equal to $R_0$.

The proper values of capacity C for condenser C15 and inductance L for coil L11 is determined in accordance with the following expressions:

$$C=\frac{1}{\pi f_r R_0} \text{ and } L=\frac{R_0}{\pi f_r}$$

where $f_r$ is an arbitrary reference frequency selected within the tuning range.

The two curves shown in Figure 9 illustrate how the output of lines L9 and L10 vary with the changes in frequency where the reference frequency is selected at 600 mc. The ordinates of Figure 9 are in terms of relative output voltages impressed across the detector load $R_0$ and the abscissa are in terms of relative frequency, that is, the ratio of the received frequency to the reference frequency. In the example illustrated in Figure 9, the reference frequency lies within the U. H. F. band. The reference frequency is selected at a value such that the relative output of line L9 in the U. H. F. band is approximately 1.0, and the relative output of line L10 in the V. H. F. band is approximately 1.0. As shown in Figure 9, the relative output of line L9 is much higher than the output of line L10 within the range from 475 mc. to 890 mc., and the relative output of line L10 within the range from 54 mc. to 216 mc. is much larger than the relative output of line L9.

While the tuned lines of the tuner may assume the form of straight sections of a coaxial cable, it is preferred to construct the lines in circular form to permit operation of the sliders from a common rotary shaft.

One suitable physical structure of the tuner and oscillator assembly is shown in Figures 2 to 8 of the drawing.

Figures 2, 3, 4, 5:
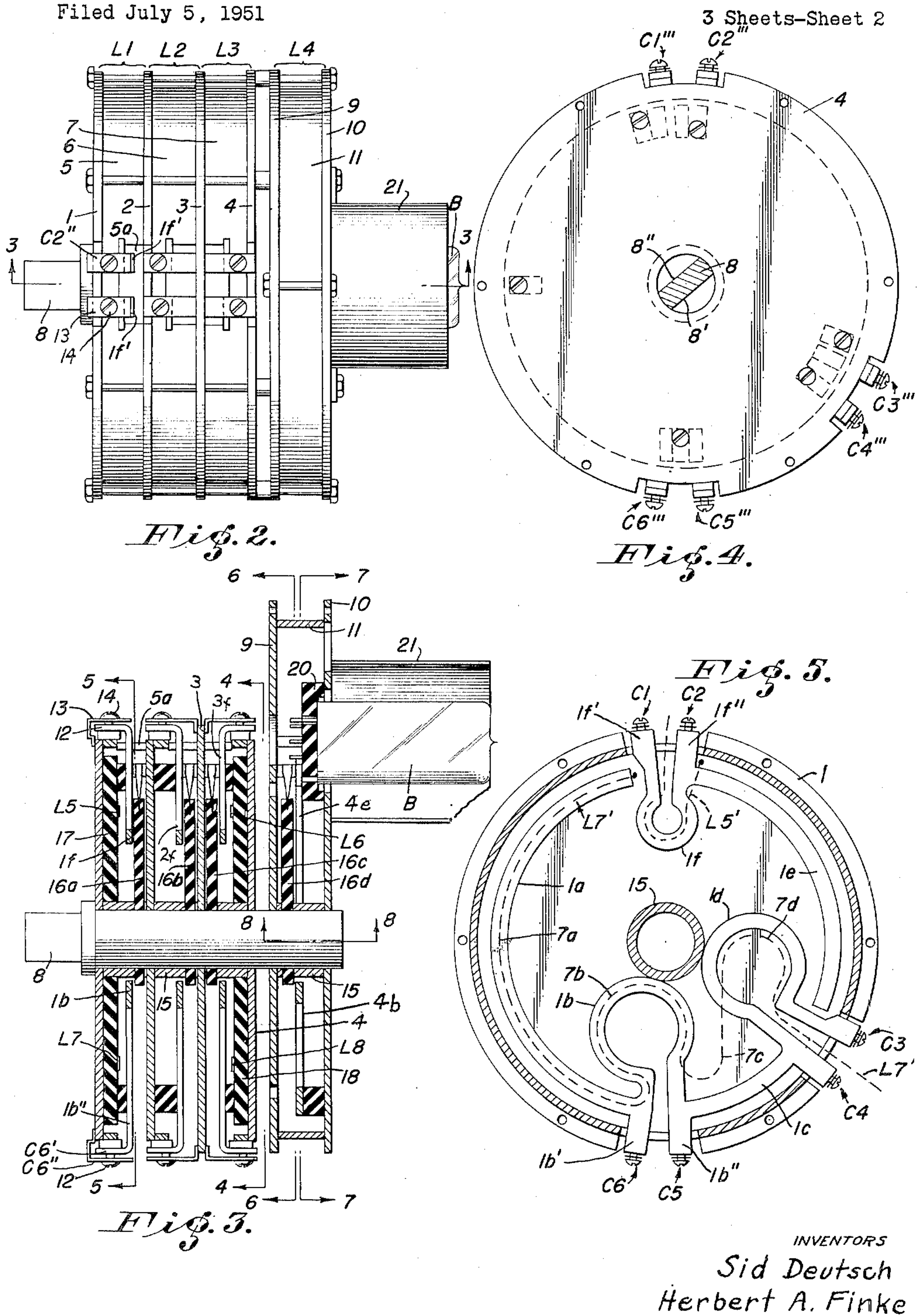
Figure 2 is a plan view of the tuner and oscillator assembly.
Figure 3 is a sectional view of Figure 2 taken along the line 3—3.
Figure 4 is a sectional view of Figure 3 taken along line 4—4 and showing the inner end of the tuner section.
Figure 5 is a sectional view of Figure 3 taken along the line 5—5.

Referring to Figures 2 to 5, the three tuner lines are formed as a unit consisting of four circular plates 1 to 4 inclusive, arranged in coaxial alignment and having cylindrical sleeves 5, 6 and 7 interposed between them to form three shields or housings for the three line conductors of the tuner. The housing members are formed of metal of good conductivity. Plates 1 to 4 have aligned round holes at the centers in which operating shaft 8 is journaled. As shown in Figure 4, the section of shaft 8 which extends through the tuner assembly is provided with parallel flat faces 8′ and 8″ for maintaining alignment of the rotary arms which carry the short-circuiting sliders.

The oscillator line L4 is also formed as a unit in alignment with the tuner unit and involves parallel plates 9 and 10 having a tubular sleeve 11 clamped between them to form the shield or housing for the oscillator line conductor. Plates 9 and 10 have circular holes at the center of the sleeve 11 for receiving the end of shaft 8. The entire assembly is held together by suitable bolts, as shown in Figure 2.

The three tuner line-conductors are all formed alike and in the manner shown in Figure 5 which shows the conductor for line L1. Preferably, each line conductor is stamped from sheet metal of good conductivity, such as copper, but it may be formed of thin metal strip deposited upon a sheet of insulating material in any suitable and well known manner. As shown in Figure 5, the conductor for line L1 is formed of an arcuate section 1*a* forming the low frequency end of the line, a looped section 1*b* bridging a narrow gap between the section 1*a* and a second arcuate section 1*c*, and a second looped section 1*d* is connected to the end of section 1*c*. The high frequency end of the tuner line is formed of an arcuate section 1*e* which does not have metallic connection with the section 1*c*, but is arranged in the same circular path as sections 1*a* and 1*c*, and looped section 1*f* is arranged at the end of section 1*e*.

The line conductor for line L1 is supported centrally between shield plates 1 and 2 upon suitable blocks of insulating material arranged at spaced points, but these have not been shown in the drawing. Each of the looped sections of the line is provided with radially extending terminal pieces which extend through an opening formed in the housing sleeve. For example, the looped section 1*f* is provided with two terminal extensions 1*f*′ and 1*f*″ extending radially outwardly through an opening 5*a* in the sleeve 5. The end portions of these extensions are bent at right angles to extend over the uncut portion of the sleeve 5, and these bent end portions constitute the fixed plates of the trimmer condensers represented at C1 and C2 in Figure 1. The trimmer condensers are constructed alike and the arrangement for condenser C2 will be described with reference to Figure 3. The bent end portion of terminal piece 1*f*″ forming the fixed plate of the condenser C2 is shown at 12. The movable plate of the trimmer condenser is formed of a thin flexible strip of metal 13 arranged in spaced relation to the plate 12 and is resiliently supported from the end plate 1. Plate 13 is adjusted with respect to plate 12 by means of a screw 14 which has threaded engagement with the uncut part of the sleeve 5 and passes through an opening in plate 12.

In Figure 4 the trimmer condenser for line L3, corresponding to condensers C1 to C6 on line L1, are indicated at C1‴ to C6‴.

The short-circuiting sliders 1*s*, 2*s*, 3*s*, and 4*s* are mounted at the end of insulating arms 16*a*, 16*b*, 16*c*, and 16*d*, which are mounted upon the shaft 8 for rotation about the axis of the tuner. Each slider is arranged to bridge the gap between the arcuate sections of the line conductor and one of the shield plates; for example, the slider 1*s* bridges the gap between line conductor L1 and shield plate 2. The slider-supporting arms are held in proper position on shaft 8 by spacer sleeves 15 surrounding the shaft.

The line conductor of each tuned line forms a circular track for one end of each slider and the gaps between different arcuate segments of the line conductor are sufficiently narrow for the slider contact to bridge the gaps in passing over them. Also, each slider arm may rotate freely in either direction and to any extent, thereby avoiding the necessity for back-tracking. It is not necessary for the sliders to engage the free ends of loop sections 1*f*, 2*f*, and 3*f*, so these ends may be set back from the circular path of the slider contact.

The input coupling loops L5 and L7 are carried by a disc of insulating material 17 supported against the inner face of end plate 1, and the output coupling loops L6 and L8 are carried by a similar disc of insulating material 18 mounted against the inner face of end plate 4. The coupling loops or lines may be formed by stamping from sheet metal, as in the case of the line conductors, or they may be formed by depositing thin strips of metallic material on the inner faces of plates 17 and 18. The two sets of coupling loops are formed alike, and in Figure 5 the dotted lines L5′ and L7′ indicate diagrammatically the arrangement of the coupling loops L5 and L7 with respect to the line conductor for line L1. As will be seen, the coupling line L7 is formed of an arcuate section *7a* which is closely coupled to the conductor section *1a*, and a loop section *7b* which is closely coupled to conductor section 1*b* throughout most of the loop. The section *7c* is loosely coupled to conductor section *1c* and the loop section *7d* is loosely coupled to the conductor loop 1*d*. The free end of the loop *7d* is connected to a source of waves and the free end of the arcuate section *7a* is grounded to the shield. The coupling loop L5, as shown in dotted lines in Figure 5, is loosely coupled to loop 1*f* and to a small portion of conductor section *1e*.

The local oscillator arrangement is illustrated in detail in Figures 3 and 6 to 8 inclusive. The two housing plates 9 and 10 are extended at the upper part of the tuner assembly to enclose the socket 20 of the oscillator tube B. The oscillator tube is inserted in the socket through an opening formed in the plate 10 and is surrounded by a cylindrical metallic shield 21 mounted on plate 10. As shown in Figure 7, the sleeve 11 also extends upwardly to enclose the tube socket 20. As shown in Figure 7, the line conductor for the oscillator has the same general form as the tuned line conductors in the tuner, but is not provided with a gap between the high and low frequency sections nor with a loop corresponding to loop 1*f* in line L1. The high frequency arcuate section 4*e* of the oscillator line has its free end supported upon the tube socket 20 and the two plate contacts of the socket are soldered directly to the end of the line section, as shown in Figure 7. It will also be observed that line section 4*e* is of greater width than the remaining sections of the oscillator line. This is for the purpose of decreasing the characteristic impedance of this section of the line to compensate for the capacity loading of the line by the oscillator tube. The required characteristic impedance may also be obtained by arranging a raised arcuate boss 22 parallel with the line section 4*e*, as shown in Figures 7 and 8. This increases the distributed capacitance of the section 4*e*. The boss 22 may be formed either of conductive material or of insulating material of high dielectric constant.

As shown in Figure 1, a condenser B*c* is connected across the oscillator line near the low frequency end to improve the stability of the oscillator at this end of the tuning range.

As shown in Figures 6 and 8, the short-circuiting slider 4*s* does not have metallic contact with any part of plate 9 by an annular sheet of insulating material 24. The free end of the oscillator line section *4a* is connected to a suitable source of direct current voltage by a connection 25, Figure 7, which passes out of the housing through the button condenser 26. It will be understood that the circular track 23 corresponds to the track L14 in Figure 1 and is provided for the purpose already indicated.

From the foregoing it will be understood that each of the two sections forming each tuned line comprises essentially a quarter-wave length section of a coaxial cable the resonant frequency of which is varied by moving the short-circuiting slider along its length. It will also be observed that since the two quarter-wave sections are arranged in alignment one slider is used on both quarter-wave sections. Amplifier A could be inserted between lines L2 and L3 instead of in the position shown in Figure 1, in which case lines L1 and L2 would be coupled in the same manner as lines L2 and L3.

What we claim is:

1. A tuner for short radio waves comprising a plurality of quarter-wave transmission lines arranged in a series, each having a short-circuiting slider for varying the length of the line, means connecting said sliders for ganged operation over a predetermined tuning range, means connecting said lines in cascade, an input coupling line inductively coupled to the first tuned line of the cascade throughout a substantial portion of the length of said first tuned line, said coupling line being supported in fixed spacial relation with respect to said first tuned line and having different linear sections thereof spaced at different distances from said portion of said first tuned line so that the coupling between different linear sections thereof and said tuned line decreases from the low frequency end of the tuned line towards the high frequency end.

2. A tuner for short radio waves comprising a tuned line formed of a quarter-wave transmission line having a short-circuiting slider for varying the length thereof, and a coupling line inductively coupled to said tuned line along a substantial portion of the length thereof, said coupling line being supported in fixed spacial relation with respect to said first tuned line and having different linear sections thereof spaced at different distances from said portion of said first tuned line so that the coupling between different linear sections thereof and said tuned line decreases from the low frequency end of the tuned line towards the high frequency end.

3. A tuner for short radio waves comprising a plurality of transmission lines each having a short-circuiting slider movable throughout the length thereof, means connecting said sliders for ganged operation over a predetermined tuning range, the transmission conductors of said lines being divided into two electrically independent linear sections comprising a low frequency section and a high frequency section, means including said sliders when operating in one portion of said range for connecting said high frequency sections in cascade in a first receiving channel, means including said sliders when operating in another portion of said range for connecting said low frequency sections in cascade in a second receiving channel separate from said first receiving channel, a detector having an input terminal, a connection including a series condenser connecting the output of said high frequency channel to said detector terminal, and a connection including a series inductance connecting the output of said low frequency channel to said detector terminal in parallel with said first mentioned connection.

4. A wide-range radio tuner comprising tunable means forming a first channel for receiving waves in a given frequency band, a second tunable means forming a second channel separate from said first channel for receiving waves in a higher frequency band, a detector having an input terminal, a connection from the output of said first receiving channel to said detector terminal including a series-connected inductance, a connection from the output of said second receiving channel to said detector terminal including a series-connected condenser, and switching means common to said two channels and operating independently of said connections for rendering one or the other of said channels operative to energize said detector.

5. A tuner for short radio waves comprising a plurality of shielded transmission lines each having a short-circuiting slider movable throughout the length thereof, means connecting said sliders for ganged operation over a predetermined tuning range, the transmission conductor of each of said lines having a gap formed therein for dividing the conductor into two electrically independent linear sections comprising a low frequency section and a high frequency section, means connecting said high frequency sections in cascade in a first receiving channel, means including an electron tube amplifier connecting said low frequency sections in cascade in a second receiving channel separate from said first receiving channel, a detector having an input terminal, means connecting the outputs of both of said channels to said detector terminal, and switching means comprising the sliders of said lines for selectively rendering one or the other of said channels operative to energize said detector.

6. A tuner for short radio waves comprising a plurality of shielded transmission lines each having a short-circuiting slider movable throughout the length thereof, the transmission conductor of each of said lines having a gap formed therein for dividing the conductor into two electrically independent linear sections comprising a low frequency section and a high frequency section, means including said sliders for connecting said high frequency sections in cascade in a first receiving channel, means including said sliders for connecting said low frequency sections in cascade in a second receiving channel separate from said first receiving channel, and operating means connecting said sliders for ganged operation throughout the tuning range of both channels, whereby selective operation of one or the other of said channels is effected by operation of said operating means.

7. A tuner for short radio waves comprising a pair of electrically independent transmission lines arranged in alignment with a small gap between adjacent ends of the conductors of said lines, individual means for applying received waves to each of said lines, a detector having an input terminal, individual connections from said lines to said detector terminal, and a single short-circuiting slider movable throughout the extent of both of said lines for selectively rendering one or the other of said lines effective to energize said detector.

8. A tuner for short radio waves comprising a pair of electrically independent transmission lines arranged in alignment, with a small gap between adjacent ends of the conductors of said lines, individual means for applying received waves to each of said lines, a detector having an input terminal, individual connections from said lines to said detector terminal, a single short-circuiting slider movable throughout the extent of both of said lines for selectively rendering one or the other of said lines effective to energize said detector, an electron tube oscillator having a frequency determining element comprising a single quarter-wave shielded transmission line having a length equal substantially to the combined lengths of said pair of shielded lines, a short-circuiting slider for said quarter-wave transmission line movable throughout the same range as the short-circuiting slider for said pair of lines, operating means connecting said short-circuiting sliders for ganged operation, and a connection for supplying oscillations from said oscillator to said detector.

9. A tuner according to claim 8 wherein one line of said pair of lines is shorter than the other and covers the high frequency portion of the tuning range, and wherein the conductor of the oscillator transmission line is enlarged in surface area throughout the tuning range covered by said high frequency line with respect to the remainder of the oscillator line.

10. A tuner according to claim 9, and including means for increasing the distributed capacitance of the oscillator tuning line over the section corresponding to the tuning range covered by said high frequency tuner line.

11. A tuner according to claim 8, and including a condenser connected across the oscillator tuning line at a point in the low frequency range thereof.

12. A tuner for a radio wave receiver comprising, at least three parallel plates of conducting material arranged in spaced relation along a predetermined axis, each of said plates having a round hole formed therein concentric with said axis, a tubular spacer sleeve of conducting material positioned between each pair of said plates in contact therewith and being positioned concentric with said axis, a line conductor arranged in a circular path between each pair of plates and surrounding said shaft, the ends of each line conductor being separated by a small gap, a rotary shaft extending through said holes, a radially extending arm mounted upon said shaft between each pair of plates, anda short-circuiting slider carried by the outer end of each arm and having sliding contact with the line conductor and with one of said plates, each slider being freely movable across the gap in its associated line conductor in either direction of movement.

13. A tuner according to claim 12 wherein the tubular sleeve between one pair of said plates extends radially outwardly along a portion of its periphery to form a pocket adjacent the line conductor positioned between said one pair of plates, one of said plates having an aperture formed therein opening into said pocket, an electron tube socket located with said pocket and positioned to receive the prongs of an electron tube through said aperture, and means supporting the ends of said line conductor on said socket.

14. A tuner according to claim 13 wherein one end of said line conductor supported by said socket is in direct contact with the plate contact of said socket.

15. A tuner according to claim 12 wherein one of said line conductors is connected to a source of direct current potential, and including an insulated track for the short-circuiting slider engaging said conductor, said track forming a condenser element with respect to one of said plates to insulate said plate from said direct current potential and providing a path of low impedance for high frequency currents.

References Cited in the file of this patent

UNITED STATES PATENTS

| | | |
|---|---|---|
| 2,336,555 | Malling | Dec. 14, 1943 |
| 2,382,693 | Dallenbach | Aug. 14, 1945 |
| 2,398,502 | Morrison | Apr. 16, 1946 |
| 2,477,391 | Reid et al. | July 26, 1949 |
| 2,505,251 | Knol | Apr. 25, 1950 |
| 2,513,392 | Aust | July 4, 1950 |
| 2,513,393 | Frey | July 4, 1950 |
| 2,516,990 | Herold | Aug. 1, 1950 |
| 2,543,560 | Thias | Feb. 27, 1951 |
| 2,551,228 | Achenbach | May 1, 1951 |
| 2,566,759 | Clark | Sept. 4, 1951 |
| 2,573,045 | Murphy | Oct. 30, 1951 |
| 2,575,702 | Baker | Nov. 20, 1951 |
| 2,584,600 | MacKimmie | Feb. 5, 1952 |
| 2,591,982 | Van Weel | Apr. 8, 1952 |
| 2,627,579 | Wasmansdorff | Feb. 3, 1953 |
| 2,631,241 | Schmidt | Mar. 10, 1953 |
| 2,666,906 | Aust | Jan. 19, 1954 |